United States Patent [19]

Nordenstrom et al.

[11] Patent Number: 5,472,347
[45] Date of Patent: Dec. 5, 1995

[54] SYSTEM FOR INTERCONNECTING I/O MODULES FOR DATA COMMUNICATIONS OVER A COMMON BACKPLANE

[75] Inventors: Peter Nordenstrom, Richmond Heights; Robert J. Coppenhaver, Bainbridge, both of Ohio

[73] Assignee: Allen-Bradley Company, Inc., Milwaukee, Wis.

[21] Appl. No.: 122,278

[22] Filed: Sep. 17, 1993

[51] Int. Cl.⁶ .................................................... H01R 9/24
[52] U.S. Cl. ............................................ 439/61; 439/928
[58] Field of Search ............................ 439/61, 928, 310, 439/361, 928.1

[56] References Cited

U.S. PATENT DOCUMENTS 4,658,375  4/1987  Onogi et al. .................... 439/928 X
5,000,692  3/1991  Taniguchi et al. ................ 439/928 X
5,205,753  4/1993  Butterfield et al. ............... 439/310 X
5,249,979  10/1993 Deinhardt et al. ................ 439/928 X

*Primary Examiner*—Z. R. Bilinsky
*Attorney, Agent, or Firm*—John J. Horn; H. F. Hamann

[57] ABSTRACT

A system for interconnecting the bus structure of separate I/O block units to form a common system backplane for data communications purposes. The system includes sets of pins and matching pin receptacles electrically coupled to bus structures on circuit boards installed on base units onto which different types of I/O modules can be removably mounted. The pins and pin receptacles for each base unit are mounted on opposite lateral sides of the base units. The pins and pin receptacles are constructed and arranged for convenient interconnection between the bases of adjacent units whereby a common system backplane may be formed.

6 Claims, 2 Drawing Sheets

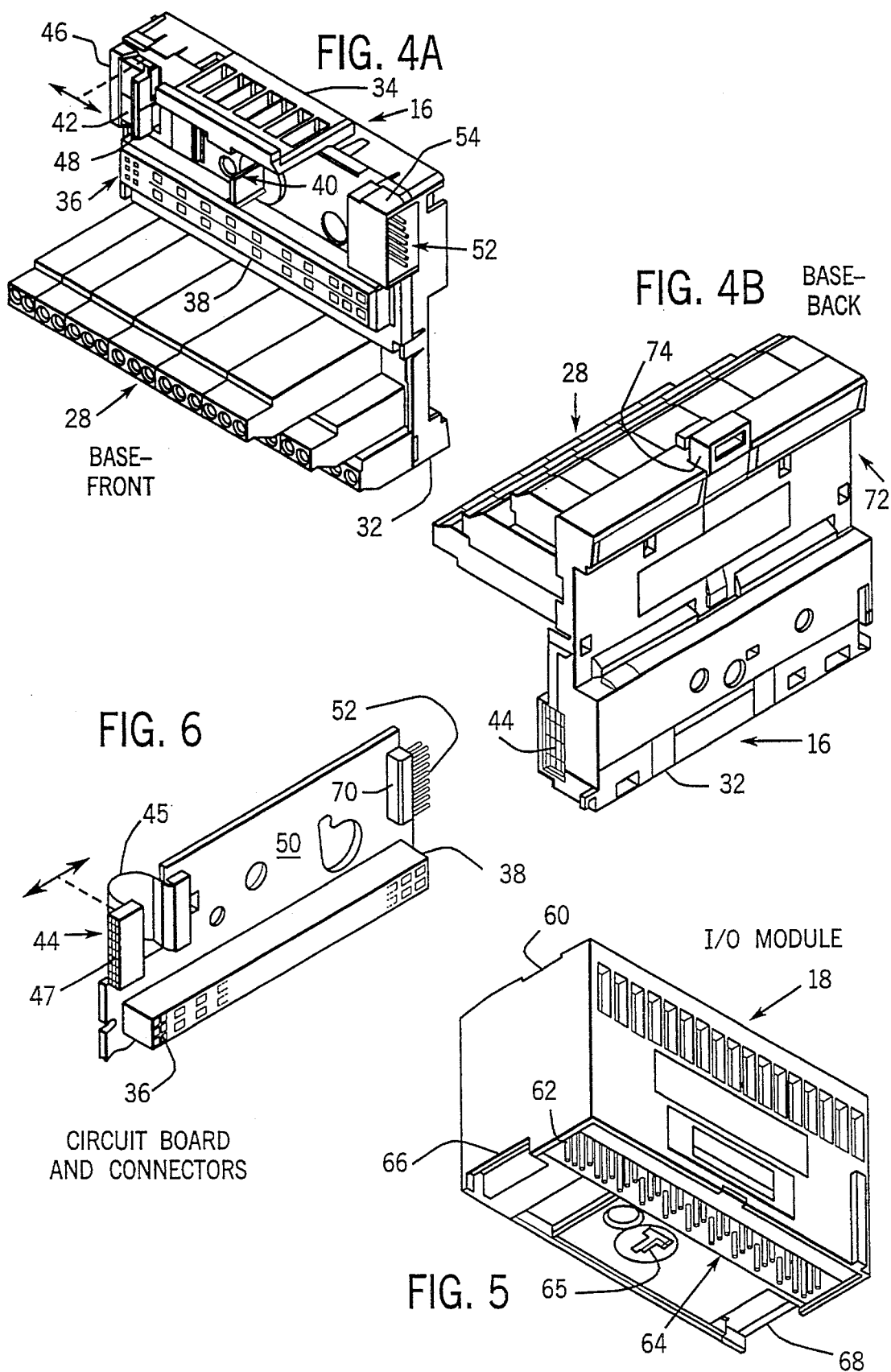

SYSTEM FOR INTERCONNECTING I/O MODULES FOR DATA COMMUNICATIONS OVER A COMMON BACKPLANE

BACKGROUND OF THE INVENTION

The present invention relates to industrial control systems and more particularly to remote input/output (I/O) systems for use in conjunction with industrial control devices such as programmable controllers.

Most control systems for use in automatically controlling production machinery and the like include a central control device such as a programmable logic controller which receives inputs from sensors such as limit switches and provides outputs to actuators for controlling operational machines such as conveyors. The outputs provided to the actuators are determined in accordance with a control program which is continuously executed by the controller and which utilizes the information from the input sensors in setting appropriate control signal outputs. Such systems are in widespread use and are entirely satisfactory except that it is frequently desired to receive inputs and provide outputs from groups of sensors and actuators located at remote locations. In order to avoid the use of large numbers of wires which are bulky and are difficult and costly to install and maintain, remote I/O systems are used which communicate with central control devices over local area networks. Such systems usually include a communications adapter for interfacing with the communications network and several I/O modules for handling different types of I/O signals. The use of remote I/O systems and network communications for transferring information to and from remote locations to central control points simplifies the implementation of control system applications and saves considerable effort and expense.

However, remote I/O systems themselves require flexible and efficient architectures. In particular, remote I/O systems should be designed to allow different types of I/O modules to be quickly and conveniently installed and removed and allow the systems to be rapidly and easily configured and reconfigured. Moreover, remote I/O systems must have efficient communications between the I/O modules and the communications adapter which interfaces with the local area network for transferring information to and from the central control device.

It is therefore an object of the present invention to provide a remote I/O system having a structure which allows for the rapid and convenient insertion and removal of different types of I/O modules and which allows such systems to be speedily and effortlessly configured and reconfigured.

It is another object of the present invention to provide a remote I/O system in which a common communications backplane can be easily assembled between adjacent units to provide a communications bus over which data can be exchanged between I/O modules and a communications adapter.

SUMMARY OF THE INVENTION

The present invention constitutes a remote Input/Output (I/O) system having a common backplane for the exchange of data between I/O modules operative for receiving and transmitting I/O signals and a communications adapter for interfacing with a communications network connected to a centrally located control device such as a programmable controller. The basic system includes a communications adapter and a number of I/O block units each of which includes a base and I/O module. The bases of the block units are adapted for being mounted in adjacent in line positions on a common mounting rail along with the communications adapter and for being electrically interconnected in a convenient manner to form a common backplane which enables serial communications between I/O modules installed on the bases and the communications adapter. Moreover, the remote I/O system allows for different types of I/O modules to be rapidly installed and removed from the system whether, for example, for replacement of faulty modules or for reconfiguration of the system.

The bases of the block units contain circuit boards having bus structures to which the I/O modules installed on the bases are automatically connected upon installation. The basic bus structure of the backplane comprises a data out line, a data in line, a set of module select lines and a clock line. Pins and pin receptacles which are coupled to the bus structure are mounted on opposite lateral sides of each of the bases for allowing the bus structures of adjacent modules to be interconnected. Moreover, in the preferred embodiment, the pin receptacles are connected to the bus structure by a ribbon cable and otherwise arranged for allowing the pin receptacles to be laterally translated into engagement with pins on an adjacent base in a convenient fashion. After interconnection of adjacent bases and the installation of I/O modules on these bases, the housings of the I/O modules are adapted for physically blocking disengagement of the pin receptacles from the pins of adjacent bases of adjacent block units.

BRIEF DESCRIPTION OF THE DRAWINGS

FIGS. 4A and 4B provide elevated perspective views of the front and back sides of bases (or base units) which interconnect to form the system backplane and on which I/O modules are removably mounted in accordance with the remote I/O system of the present invention.

FIG. 5 provides a perspective view of an I/O module in accordance with the remote I/O system of the present invention.

FIG. 6 provides a diagrammatic view of the circuit board, bus structure and backplane elements of a base (or base unit) in accordance with the remote I/O system of the present invention.

DESCRIPTION OF THE PREFERRED EMBODIMENT

Figure 1:
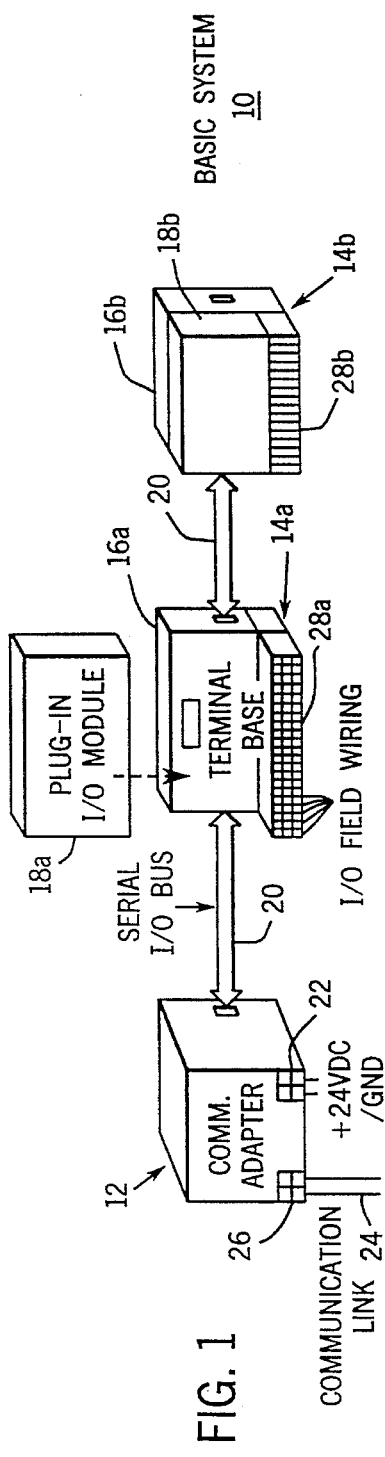
FIG. 1 provides a diagrammatic view of the overall mechanical arrangement of a remote I/O system in accordance with the present invention.

Referring now to FIG. 1, a modular Input/Output (I/O) system 10 is shown as including a communications adapter 12 and two I/O block units 14a and 14b which are connected for local communications purposes to a serial bus forming a common system backplane 20 between the units 14a and 14b and the adapter 12. The communications adapter 12 is connected at terminals 22 to a power supply and ground and is connected at terminals 26 onto an external communications link 24 which may comprise any of a variety of local area networks (LANs) suitable for use in industrial control applications. The I/O block units 14a and 14b include base or base units 16a and 16b through which the backplane 20 extends and include plug-in I/O modules 18a and 18b which can be readily installed onto the base units 16a and 16b and which may be selected to handle a variety of I/O signals. The base units 16a and 16b also include sets of terminals 28a and 28b for connection to actual input and/or output devices such as sensors or actuators.

Figure 2:
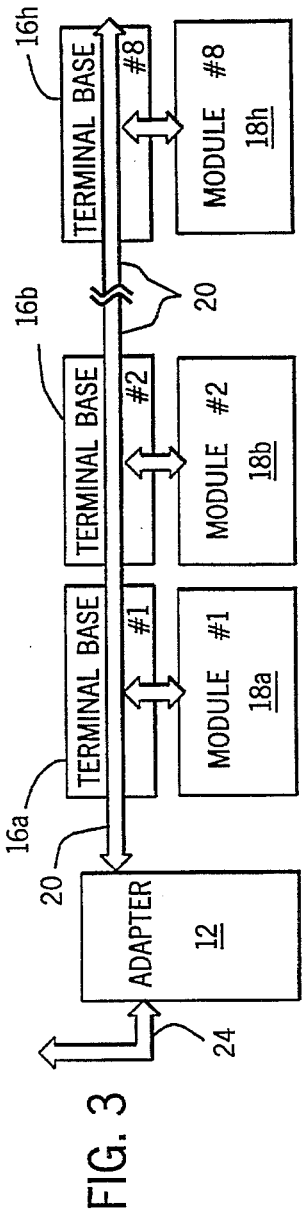
FIG. 2 provides a diagrammatic view of a remote I/O system having multiple I/O modules installed in an inline fashion in accordance with the present invention.

Referring now to FIG. 2, the modular I/O system 10 may include up to eight I/O block units 14a–14h which are mounted in laterally adjacent in line positions on a mounting rail 30 such as a DIN rail. The individual plug-in I/O modules 18a–18h corresponding to the block units 14a–14h may be of a variety of different types adapted for handling either inputs or outputs comprising either analog, discreet or digital signals. The adapter 12 is always mounted at the left end of the line of I/O block units 18a–18h with one adapter 12 having the capacity for acting as a communications master with respect to eight or any lesser number of I/O block units which operate as communications slaves.

Figure 3:
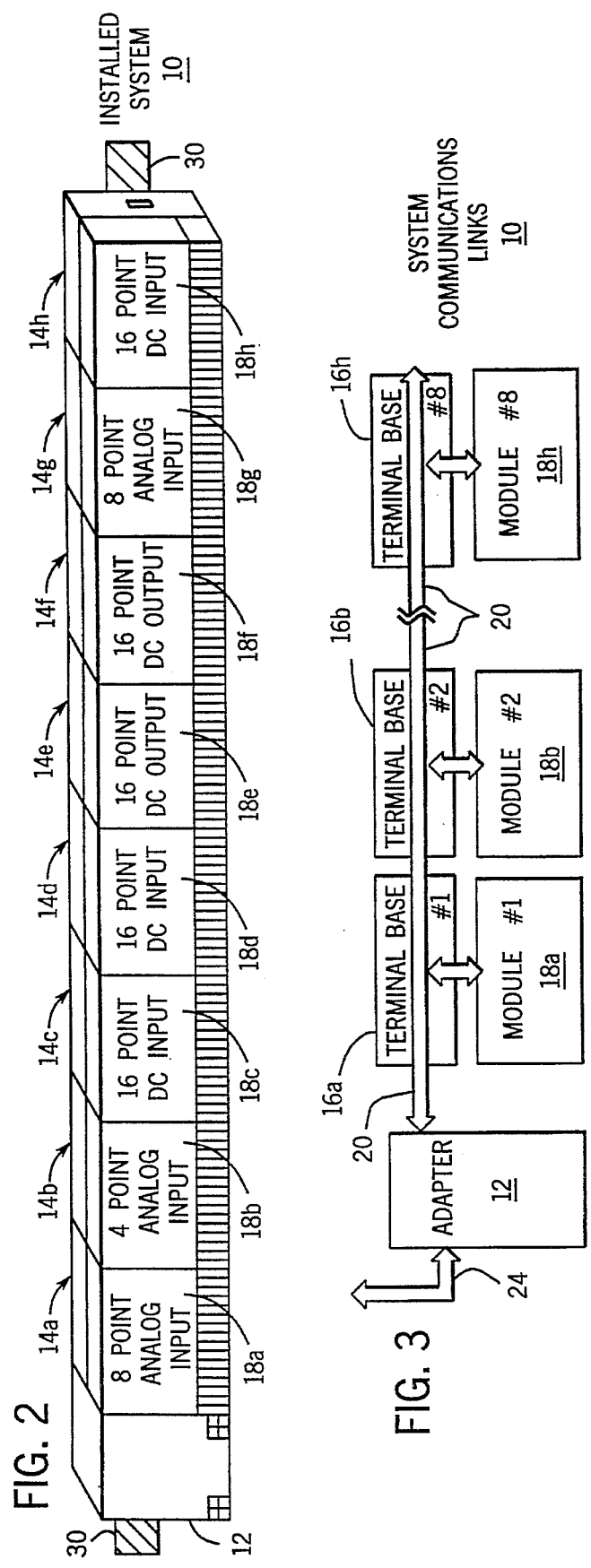
FIG. 3 provides an overall block diagram view illustrating the communications links which characterize the remote I/O system of the present invention.

Referring now to FIG. 3, in the modular I/O system 10 the base units 16a, 16b–16h are interconnected to form a local serial bus system backplane 20 which also interconnects with the communications adapter 12. The backplane 20 includes a group of differential clock line(s), a reset line, a set of eight select lines, a data out line, a data in line, a power supply line and a ground line. The I/O modules 18a, 18b–18h are installed onto the base units 16a, 16b–16h and thereby coupled to the backplane 20 for local communications with the adapter 12. The adapter 12 exchanges data with I/O modules 18a, 18b–18h via the base units 16a, 16b–16h over the backplane 20 and with remote control devices such as programmable logic controllers over the network communications link 24 which provides higher bandwidth communications with such devices.

Referring now to FIG. 4A, an individual base unit 16 includes a frame 32 in which the terminals 28 are disposed in three tiers and includes a latch 34 which is attached to the frame 32 for gripping an I/O module 18 and holding it in position on the base unit 16. A set of pin receptacles 36 are deployed across a connector 38 for making electrical contact with matching pin connectors in the bottom of any I/O modules 18 which may be installed onto the base unit 16. A key 40 for matching with a keyhole in the bottom of the I/O modules 18 is mounted on the base unit 16 for making sure that the base unit 16 is compatible with any particular I/O module 18 that may be installed on it.

As shown in FIG. 4B, the bottom of the base 16 includes a channel 72 for accommodating a mounting rail 30 on which the base 16 can be locked into position through the operation of a latch 74. The latch 74 is spring loaded for movement in and out with respect to the channel 72 in order to be able to grip onto the mounting rail 30. The latch 74 is adapted for allowing the base unit 16 to be snapped into position on the rail 30. Thereafter, the latch 74 bears down underneath the edge of the mounting rail 30 thereby locking the base 16 into position. A casing 42 for mounting a set of pin receptacles 44 is disposed on one lateral side of the base unit 16 within a rectangular guide bracket 46 which allows for the casing 42 and receptacles therein to be laterally translated. A thumb lever 48 is attached to the casing 42 and extends upward from the base unit 16 to allow the casing 42 to be moved with a small amount of manually applied force. A set of electrical pins 52 are mounted in another casing 54 which is attached to the other lateral side of the base unit 16 opposite from the casing 42. The casing 42 and pin receptacles 44 are adapted for mating with pins such as the pins 52 on an adjacent base unit of another I/O block unit. Likewise, the pins 52 in the casing 54 are adapted for mating with receptacles such as the pin receptacles 44 in the casing 42 on an adjacent base unit of another I/O block unit.

Once a set of block units 14 are mounted in adjacent in line positions on a mounting rail 30, the casings 42 and pin receptacles 44 can be slid laterally outward from their base units 16 into contact and engagement with pins 52 on all adjacent base units 16 (of different I/O block units) for electrically interconnecting all of the base units 16 to form a common backplane 20.

As better shown in FIG. 6, each base unit 16 includes a circuit board 50 on which a bus structure is disposed for electrically interconnecting the pin receptacles 44, pins 52 and pin receptacles 36 (for connecting to an I/O module 18). The pin support bar 70 (which is normally secured within the casing 54) is mechanically attached to the circuit board 50 in a fixed position while the pins 52 are electrically coupled to the bus structure on the circuit board 50. The receptacle support bar 47 (which is normally secured within the casing 42) is mechanically connected by a ribbon cable 45 to the circuit board 50 which allows for lateral movement. The ribbon cable 45 also serves to electrically interconnect the pin receptacles 44 to the bus structure on the circuit board 50 and enables the receptacles 44 to be laterally translated into engagement with pins 52 on adjacent I/O block units. After engagement of all pin receptacles 44 with all pins 52 of all adjacent block units 14 in an I/O system 10, the I/O modules 18 can be latched onto the base units 16 using latches 34 to complete the I/O system 10.

Referring now to FIG. 5, an individual I/O module 18 comprises a block housing 60 for enclosing electrical components, a connector 62 including pins 64 for interconnecting with the pin receptacles 36 in a connector 38 on a base unit 16, a keyhole 65 for mating with a key 40, a recess 66 for providing a space to accommodate the casing 42 and lever 48 and a recess 68 for providing a space to accommodate the casing 54. However, the recess 66 is relatively shallow in its lateral dimensions so that it obstructs any lateral movement by the casing 42 which might result in disengagement between receptacles 44 and pins 52 of an adjacent base 16 once the I/O module 18 is in place on the base 16.

While particular embodiments of the present invention have been shown and described, it should be clear that changes and modifications may be made to such embodiments without departing from the true scope and spirit of the invention. It is intended that the appended claims cover all such changes and modifications.

We claim:

1. A system for forming a common communications backplane from the bus structures of a plurality of adjacent Input/Output block units mounted onto a common mounting rail each of which block units include a base having bus lines integrated into a printed circuit board installed on said base, said system comprising:

an interconnection system mounted on each base of each block unit for interconnecting said bus structures, said interconnection system including:

a set of pins mounted on a pin support bar on a first lateral side of said base which are electrically coupled to the bus lines in the base;

a set of pin receptacles mounted onto a receptacle support bar on a second lateral side of each of said base opposite from said first lateral side which are electrically coupled through a ribbon cable to the bus lines in the base; and a slidable casing in which said receptacle support bar is secured for laterally sliding said pin receptacles forward into engagement with pins on a base of an adjacent block unit.

2. The system of claim 1, wherein said slidable casing includes a thumb lever which is attached to and extends upward from said base for use in manually translating said casing to actuate the engagement of said pin receptacles and adjacent pins.

3. The system of claim 2, further including an I/O module for housing electronic components which may be mounted onto said base after said casing is translated to actuate pin and receptacle engagement and which physically obstructs the movement of said thumb lever and thereby prevents said pin receptacles from sliding out of engagement with adjacent pins.

4. A system for forming a remote Input/Output (I/O) network by mechanically and electrically interconnecting a plurality of (I/O) block units each of which is comprised of an I/O module for housing electronic components and a base for removably mounting the I/O module having bus lines integrated onto a circuit board installed in said base, said system comprising:

a laterally extending mounting rail;

means attached to each of said bases for latching said bases onto said rail in laterally adjacent positions;

means attached to each of said bases for sliding a first electrical connector which is electrically coupled to the bus lines on this first base into engagement with a second matching connector which is adapted for mating with said first connector and is electrically coupled to bus lines on a second different base positioned laterally adjacent to said first base; and means for latching said I/O modules onto said bases so that they physically obstruct said connectors from sliding out of engagement after they are engaged.

5. The system of claim 4, wherein each of said means for sliding includes a ribbon cable for flexibly connecting said first connector to the bus lines on the first base.

6. The system of claim 4, wherein each of said means for sliding a first connector includes a rectangular guide bracket attached to the first base.

* * * * *